US012620778B2

(12) United States Patent
O'Daniel et al.

(10) Patent No.: US 12,620,778 B2
(45) Date of Patent: May 5, 2026

(54) COMPACT, SURFACE-MOUNTED VCSEL ILLUMINATORS

(71) Applicant: II-VI Delaware, Inc., Wilmington, DE (US)

(72) Inventors: Jason O'Daniel, Gunter, TX (US); Pei-Song Cai, Taoyuan (TW); Hong-Zhi Liu, Taoyuan (TW); Francesco Schiattone, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 822 days.

(21) Appl. No.: 17/848,843

(22) Filed: Jun. 24, 2022

(65) Prior Publication Data

US 2023/0420917 A1     Dec. 28, 2023

(51) Int. Cl.
*H01S 5/183*        (2006.01)
*H01S 5/02253*      (2021.01)

(52) U.S. Cl.
CPC ...... *H01S 5/18305* (2013.01); *H01S 5/02253* (2021.01); *H01S 5/18388* (2013.01); *H01S 5/18394* (2013.01)

(58) Field of Classification Search
CPC .................................................. H01S 5/02253
See application file for complete search history.

(56) References Cited

U.S. PATENT DOCUMENTS

| | | | |
|---|---|---|---|
| 10,374,387 | B2 | 8/2019 | Stapleton et al. |
| 10,714,892 | B2 | 7/2020 | Tatum et al. |
| 10,823,365 | B2 | 11/2020 | Gray et al. |
| 10,971,892 | B2 | 4/2021 | Stapleton et al. |
| 11,294,107 | B2 | 4/2022 | Greiner et al. |
| 11,353,634 | B2 | 6/2022 | Tatum et al. |
| 2017/0123218 | A1* | 5/2017 | Stigwall ............. G01B 11/2518 |
| 2019/0115505 | A1* | 4/2019 | Tsai .................... H01S 5/02375 |
| 2019/0115725 | A1 | 4/2019 | Lai et al. |
| 2020/0067264 | A1* | 2/2020 | Guo .................... H01S 5/02257 |

(Continued)

FOREIGN PATENT DOCUMENTS

CN          101814572  A  *  8/2010

OTHER PUBLICATIONS

English Translation of Chen (Year: 2010).*

(Continued)

*Primary Examiner* — Minsun O Harvey
*Assistant Examiner* — Stephen Sutton Kotter
(74) *Attorney, Agent, or Firm* — Blank Rome LLP

(57) ABSTRACT

VCSEL-based flood illuminators are fabricated to be compact and surface-mounted devices. A substrate is constructed as a panel array having top and bottom electrodes. Individual ones of the VCSEL dies are mounted in electrical communication with pairs of the top electrodes. The VCSEL dies are encased in an encasement disposed on the top surface of the substrate, and a diffuser structure is nano-imprinted adjacent each of the VCSEL dies. The encasement can use a potting resin and a polymer layer. The potting resin encases the VCSEL dies. The polymer layer is softer and is disposed on the potting resin. Nanoimprint lithography forms the diffuser structures in the polymer layer. The panel array is then singulated to form the individual VCSEL-based flood illuminators.

14 Claims, 4 Drawing Sheets

(56)     References Cited

U.S. PATENT DOCUMENTS

| 2020/0251882 | A1 | | 8/2020 | Lyon et al. | |
|---|---|---|---|---|---|
| 2021/0057889 | A1 | * | 2/2021 | O'Daniel | |
| 2022/0029386 | A1 | * | 1/2022 | Pajkic | H01S 5/183 |
| 2022/0264076 | A1 | * | 8/2022 | Makinen | G02F 1/133538 |
| 2022/0344899 | A1 | * | 10/2022 | Dossi | H01S 5/0201 |
| 2022/0407289 | A1 | * | 12/2022 | Shi | H01S 5/0239 |

OTHER PUBLICATIONS https://www.gluespec.com/Materials/SpecSheet/dee6a053-4b5d-4cab-8616-1ee131cbbde6 (Year: 2025).*
https://industrialclear.com/blogs/learn/hard-durable-solid-strong-epoxy-resin#:~:text=Once%20fully%20cured%2C%20Industrial%20Clear,full%20cure%20at%2048%20hours. (Year: 2025).*
Gimkiewicz, C. et al., "Wafer-scale replication and testing of micro-optical components for VCSELs," Proceedings of SPIE vol. 5453, Sep. 8, 2004, 15-pgs.
Moench, H. et al, "VCSEL arrays with integrated optics," Proc. SPIE 8639, Mar. 13, 2013, 11-pgs.

\* cited by examiner

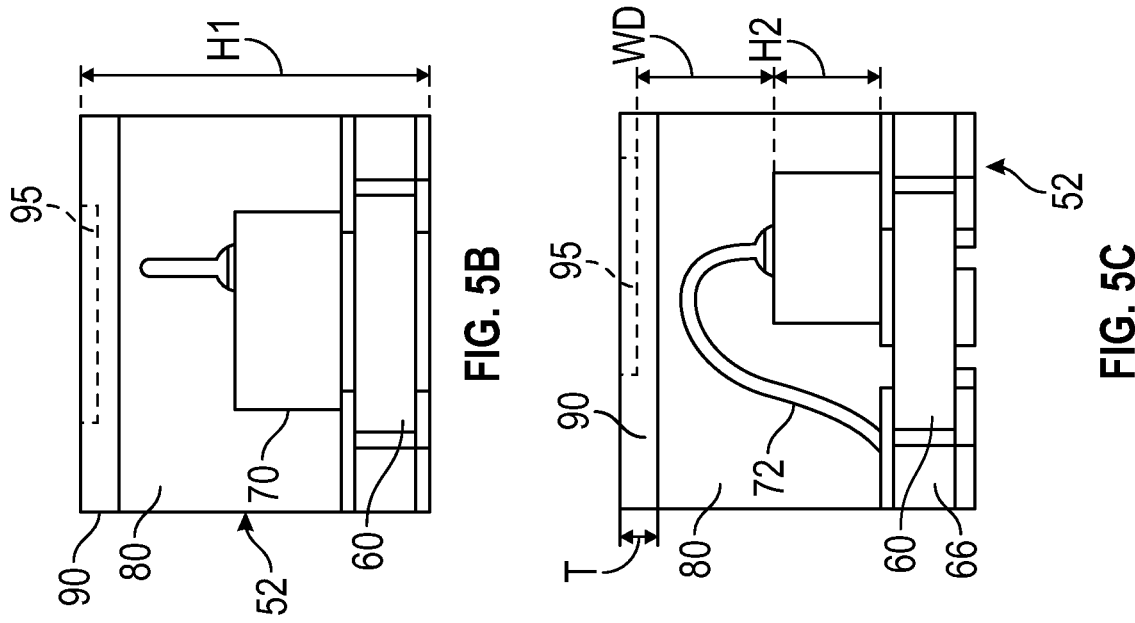
FIG. 5B
FIG. 5C
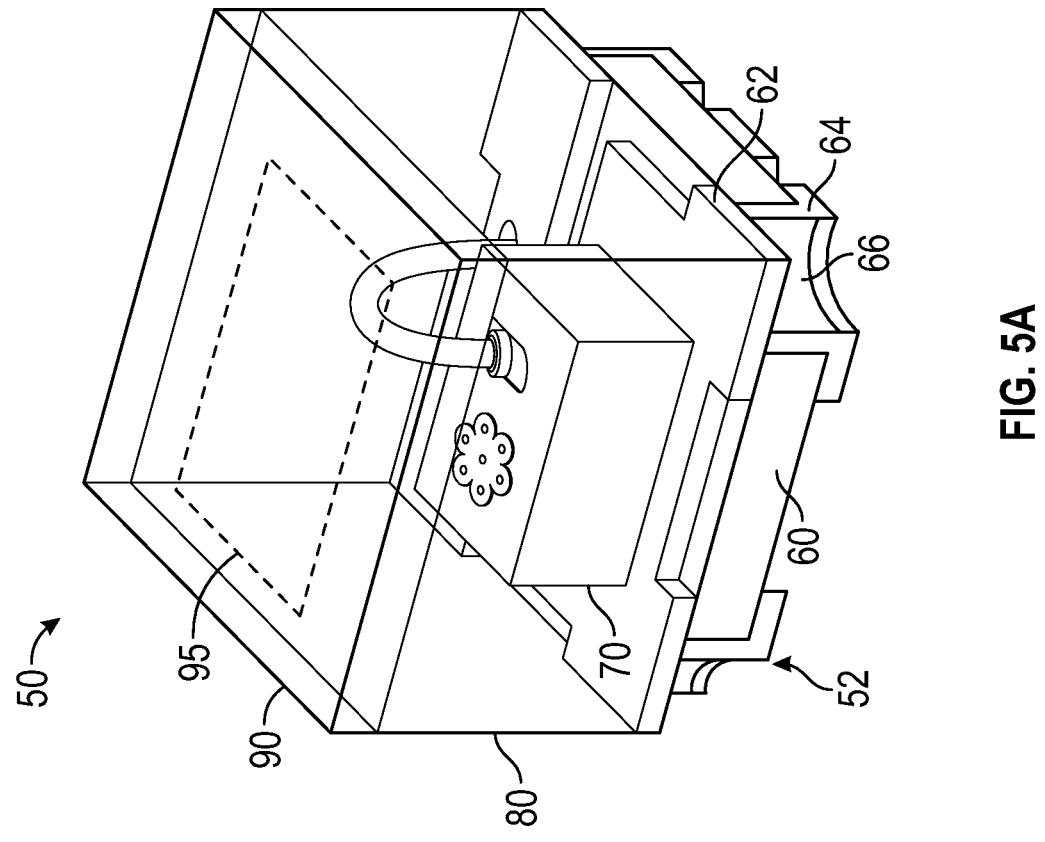
FIG. 5A

US 12,620,778 B2

1

COMPACT, SURFACE-MOUNTED VCSEL ILLUMINATORS

FIELD OF THE DISCLOSURE

The subject matter of the present disclosure is directed to a flood illuminator for use in three-dimensional sensing and two-dimensional imaging. In particular, the subject matter is direct to a flood illuminator based on a vertical-cavity surface-emitting laser (VCSEL).

BACKGROUND OF THE DISCLOSURE

Flood illuminators are incorporated into various products, such as mobile phones and other devices, to provide 3D sensing capabilities, 3D mapping in robotics, face detection, etc. For example, FIG. 1 shows a flood illuminator 10, which can be incorporated within a mobile device or the like. The flood illuminator 10 has a vertical-cavity surface-emitting laser (VCSEL) 30 that modulates a flood beam emitted to a diffuser 46. In turn, the diffuser 46 produces a modulated floodlight having a uniform field of illumination of infrared (IR) light. The floodlight is output onto an object or person of interest (not shown), and an infrared camera (not shown) captures images of the depth signature from the modulated IR floodlight.

The flood illuminator 10 based on the VCSEL 30 as shown here is being considered more and more as a replacement for conventional illuminators that are based on light-emitting diodes (LEDs). For example, the VCSEL-based flood illuminator is currently used in many 3D sensing time-of-flight applications. However, in some applications, the standard package for the VCSEL-based illuminator 10 is too large.

For example, the standard package for the VCSEL-based flood illuminator 10 shown in FIG. 1 has the VCSEL 30 mounted on a substrate 20 to provide illumination. The substrate 20 has top and bottom electrode pads 22, 24. A housing 40 is mounted to the substrate 20 and includes sidewalls 44 supporting the diffuser 46, which is separated by an air cavity 42 above the VCSEL 30. The diffuser 46 is positioned at a minimum distance away from the VCSEL apertures to function properly. This arrangement protects the diffuser's surface, but the housing 40 holding the diffuser 46 requires a larger package. For harsh environments, the structure of this arrangement also needs to be robust to avoid the diffuser 46 from being cracked or detached.

For a VCSEL-based flood illuminator to be suitable for use in some applications, the package for the VCSEL-based illuminator needs to be as small as possible. Still, the VCSEL-based illuminator needs an integrated beam shaping diffuser to provide a correct illumination pattern.

The subject matter of the present disclosure is directed to overcoming, or at least reducing the effects of, one or more of the problems set forth above.

SUMMARY OF THE DISCLOSURE

A flood illuminator disclosed herein comprises a substrate, a vertical-cavity surface-emitting laser (VCSEL) die, an encasement, and a diffuser structure. The substrate has bottom and top surfaces. The bottom surface has bottom electrodes, and the top surface has top electrodes. The VCSEL die is mounted in electrical communication with the top electrodes and is configured to emit laser illumination. The encasement is disposed on the top surface of the substrate and encases the VCSEL die. The diffuser structure is nano-imprinted in the encasement adjacent the VCSEL die.

A method disclosed herein is directed to fabricating flood illuminators. The method comprises: constructing a substrate in panel form having top electrodes on a top surface and having bottom electrodes on a bottom surface; mounting individual ones of vertical-cavity surface-emitting laser (VCSEL) dies in electrical communication with pairs of the top electrodes; encasing the VCSEL dies in an encasement disposed on the top surface of the substrate; and nano-imprinting a diffuser structure adjacent each of the VCSEL dies to form individual VCSEL-based flood illuminators.

The foregoing summary is not intended to summarize each potential embodiment or every aspect of the present disclosure.

BRIEF DESCRIPTION OF THE DRAWINGS

FIGS. 5A-5E illustrate perspective, front, side, top, and bottom views of a BT-style package for a VCSEL-based flood illuminator according to the present disclosure.

FIG. 6 illustrates a ceramic-type package for the VCSEL-based flood illuminator according to the present disclosure.

DETAILED DESCRIPTION OF THE DISCLOSURE

Figure 2A:
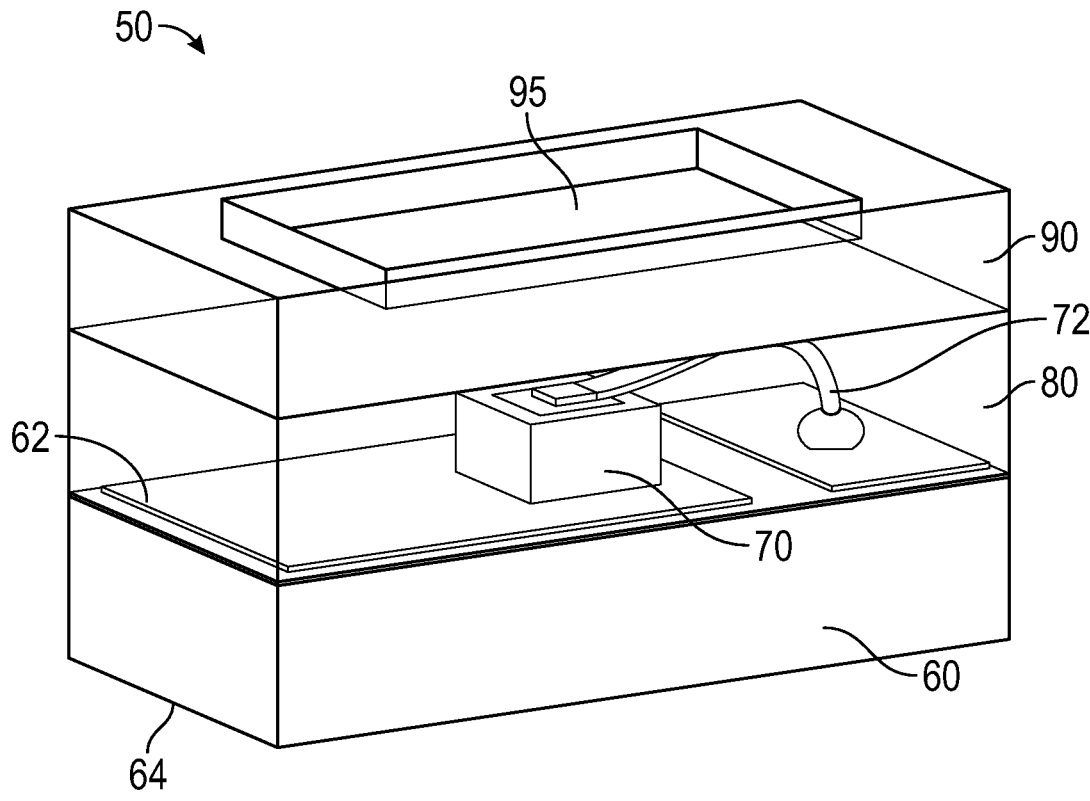
FIG. 2A illustrates a perspective view of a VCSEL-based flood illuminator according to the present disclosure.
Figure 2B:
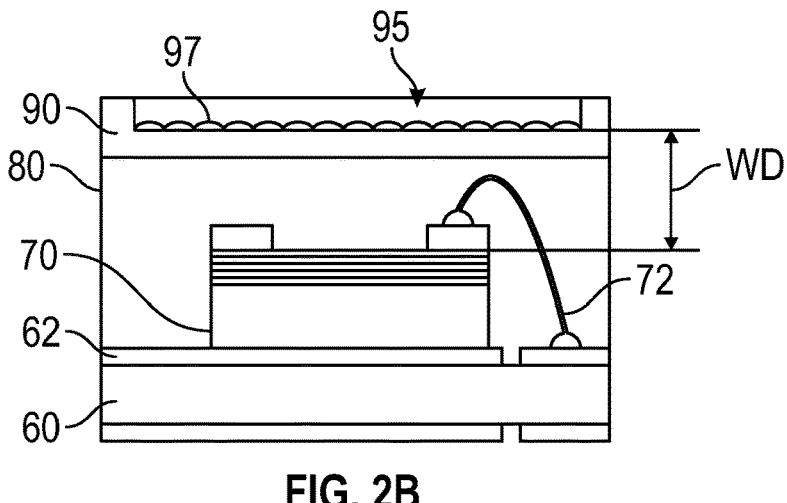
FIG. 2B illustrates a side view of the disclosed VCSEL-based flood illuminator.

FIGS. 2A-2B illustrate perspective and side views of a VCSEL-based flood illuminator 50 according to the present disclosure. The illuminator 50 is configured as a chip-scale package (CSP) and is shown as a single unit here. The illuminator 50 includes a substrate 60 having electrode pads 62, 64 disposed on the top and bottom surfaces thereof. A VCSEL die 70 is mounted on one of the top electrodes 62 and is wire-bonded to the other top electrode 62. A potting resin 80 disposed on the substrate encases the VCSEL die 70. A polymer layer 90 is disposed on the potting resin 80 and has an optical diffuser structure 95 nano-imprinted therein.

The optical diffuser structure 95 is used as an integrated beam shaping diffuser to modify the illumination pattern from the VCSEL die 70 to create the correct illumination pattern from the illuminator 50. The VCSEL die 70 can have one or more VCSEL emitters. Meanwhile, the optical diffuser structure 95 includes one or more micro-optic elements or lenslets 97, which can be comparable to features typically used for diffusing light. In general, the optical diffuser structure 95 can have an outer layout that is square, rectilinear, or another shape.

Overall, the one or more lenslets 97 can be configured to refract/diffract light from the VCSEL die 70 incident thereto. For example, the one or more lenslets 97 can include a free-form surface that shapes incident light into desired illumination or diffused profile. Finally, the optical diffuser structure 95 can be arranged at an appropriate working distance WD from the VCSEL die 70 to diffuse the light emitted from the VCSEL 70.

Figure 3:
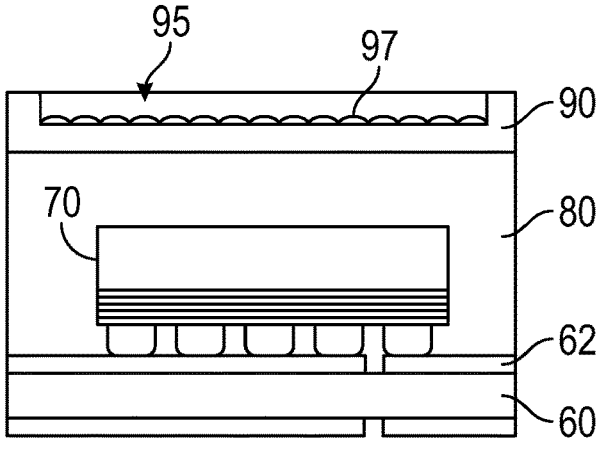
FIG. 3 illustrates another side view of the disclosed VCSEL-based flood illuminator with a flip-chip mounted VCSEL.

CSP assembly methods are used to assemble the VCSEL die 70 and to add the nano-imprinted diffuser structure 95 on top to provide the diffuser function. In particular, surface-mounted technology (SMT) packaging processes mount the VCSEL on the substrate 60, wire-bond the VCSEL die 70 to one of the top electrode pads 62, and encase the VCSEL die 70 in the potting resin 80. Flip-chip VCSEL attachment could also be used instead, as shown in FIG. 3. The polymer layer 90 is formed on the potting resin 80, and the optical diffuser structure 95 is nano-imprinted in the polymer layer 90. The diffuser structure 95 serves to shape the output from the VCSEL die 70 into the desired emission pattern.

Figure 4:
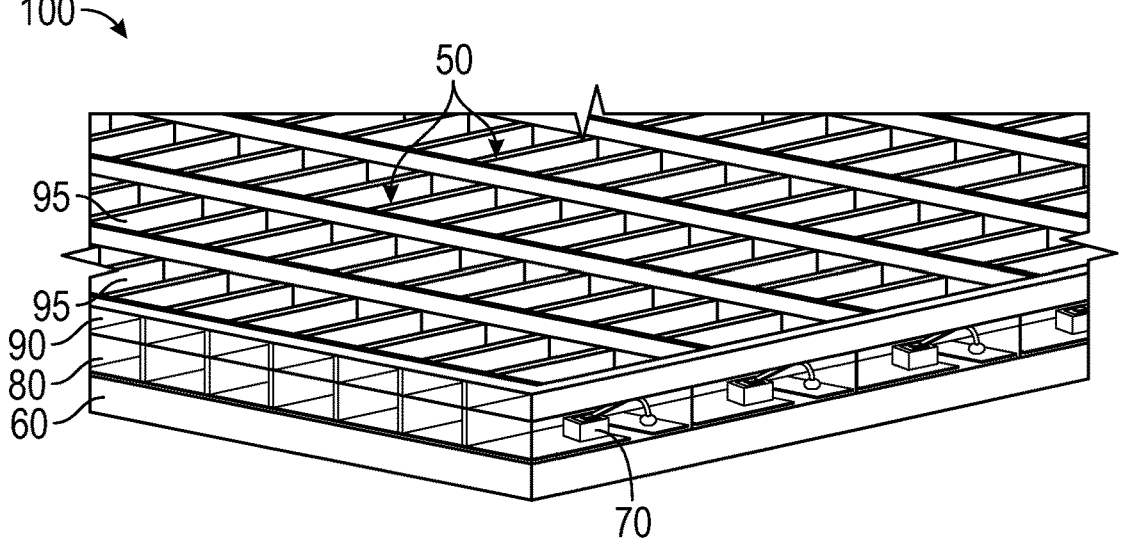
FIG. 4 illustrates a panel-level assembly of VCSEL-based flood illuminators according to the present disclosure.

The VCSEL-based illuminator 50 is fabricated in bulk and then segmented into individual packages. For example, FIG. 4 illustrates a panel-level assembly 100 having a bulk arrangement of the VCSEL-based illuminators 50. The panel-level assembly 100 includes a substrate 60 fabricated in panel form as a panel array through a common process, such as bismaleimide triazine (BT) laminate, ceramic, lead frame, etc. Individual VCSEL dies 70 are attached to the substrate 60 of the panel array using a die-attaching epoxy that attaches the VCSEL dies 70 to one of the electrical pads 62 on the substrate 60. The individual VCSEL dies 70 are wire bonded to an adjacent electrical connection pad 62. (As already noted, flip-chip VCSEL attachment could also be used instead.) Additionally, a monitor photodiode (not shown) may also be included on the substrate 60 adjacent each VCSEL die 70 as a means to monitor the relative optical power.

The top surface of the entire substrate 60 of the panel array is potted with an appropriate optically clear resin 80. This resin 80 can be a resin with a Shore D level hardness that provides structural rigidity. After the potting resin 80 cures, a polymer layer 90 is applied to the top of this cured resin layer 80.

Optical diffuser structures 95 are then nano-imprinted in the polymer layer 90 with a desired optical diffuser pattern for each of the VCSEL dies 70. Nano-imprinting the optical diffuser structure 95 can use a nanoimprint lithography (NIL) process to fabricate the pattern of nanoscale features. It is possible that instead of separate layering and curing of the potting resin 80 followed by layering of the polymer layer 90, one layer could be used should the material of the layer provide sufficient structural rigidity and be amenable to nanoimprint lithography. The entire panel-level assembly 100 is then singulated to produce individual VCSEL-based flood illuminators 50 that each form a surface-mount technology (SMT) package.

Figure 1:
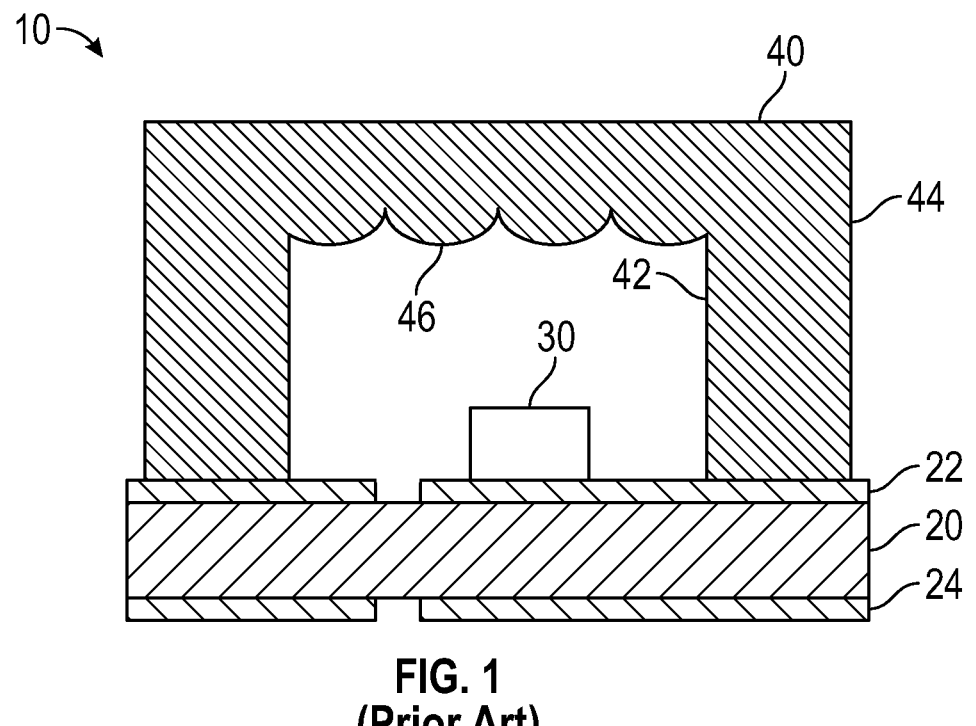
FIG. 1 schematically illustrates a VCSEL-based flood illuminator according to the prior art.

Because this VCSEL-based flood illuminator 50 has no sidewalls to support the diffuser structure 95, the panel-level assembly 100 can produce VCSEL-based flood illuminators 50 as small as 0.5 mm×0.5 mm in lateral extent. In that case, the VCSEL-based illuminator 50 can be used as a replacement for some of the current VCSEL-based illuminators because the architecture of the disclosed illuminator 50 may allow for a lower-cost alternative to the current cavity-based package, such as described previously with reference to FIG. 1.

As noted in the background, present VCSEL-based illuminators consist of a housing having an air cavity inside with an optical diffuser supported to face the VCSEL. This protects the diffuser's surface but requires a larger package due to the supporting sidewalls to hold the diffuser. Such a conventional package would typically be more than 8 times the size in volume compared to the VCSEL-based illuminator 50 disclosed herein.

As noted above, the substrate 60 for the panel-level assembly 100 can be fabricated as a panel array through a common process, such as bismaleimide triazine (BT) laminate, ceramic, lead frame, etc. FIGS. 5A-5E illustrates perspective, front, side, top, and bottom views of a BT-style package 52 for a VCSEL-based flood illuminator 50 according to the present disclosure.

In the BT-style package 52, the substrate 60 is a BT substrate, which can have a thickness of 0.1 to 0.12 mm. The substrate 60 includes blind via holes 66 for connecting the bottom electrode pads 64 to the top electrode pads 62 on the substrate 60. The blind via holes 66 can increase the soldering area and can give good molding feasibility. Thermal vias are not used due to the mismatch between the top and bottom electrode pads 62, 64.

A solder mask 65 separates the bottom electrode pads 64*a-b*. The VCSEL die is attached to one of the top electrodes 62*a* and is wire-bonded to the other electrode 62*b*. The potting resin 80 can be a silicone-elastomer having Shore D hardness for structural strengthening. The polymer layer 90 can be a silicone elastomer, such as polydimethylsiloxane (PDMS), having a Shore A hardness, being softer than the potting resin 80. The nano-imprinted diffuser structure 95 (shown in outline) is formed in the polymer layer 90.

In general, the package 52 can have dimensions of about 0.5 mm to 2 mm (width W) by 0.3 mm to 2 mm (depth D) by 0.45 mm to 1.5 mm (height H1). In the present example, the plan dimensions (W, D) of the package 52 can be about 0.5 mm by about 0.5 mm. The entire height (H1) of package 52 can be about 0.45 mm. Of this height (H1), the thickness of the BT substrate 60 can be about 0.1 to 0.12 mm. For its part, the potting resin 80 can be about 0.3 mm in height to cover the VCSEL die 70, which itself is about 0.13 mm high (H2). The thickness of the potting resin 80 can therefore be in a range of about 0.3 mm to 1 mm. The polymer layer 90 for the nano-imprinted diffuser (95) can be about 0.05 mm in thickness (T). In general, the thickness (T) can have a range between about 0.05 mm to 0.2 mm.

In general, the optical diffuser structure 95 can have an outer layout that is square, rectilinear, or another shape and can have dimensions X and Y in the range of mm to 1 mm. As noted above, the optical diffuser structure 95 includes one or more micro-optic elements or lenslets 97 comparable to features typically used for diffusing light. For example, a plurality of the lenslets 97 can be arranged in a periodic array of free-form surfaces that shape incident light into desired illumination or diffused profile. (Only one lenslet 97 is schematically outlined in FIG. 5D for illustrative purposes). The lenslets 97 can be arranged at a pitch of about 20 microns from one another in the array, and each lenslet 97 can be the same as or different from one another and can be designed to spread the incoming light over a specified field of illumination. In this example, the working distance ("WD")—i.e., the distance between the VCSEL die 70 and optical diffuser structure 95—can be about 0.15 mm. Further, this WD can range up to about 0.85 mm.

Figures 5D, 5E, 6:
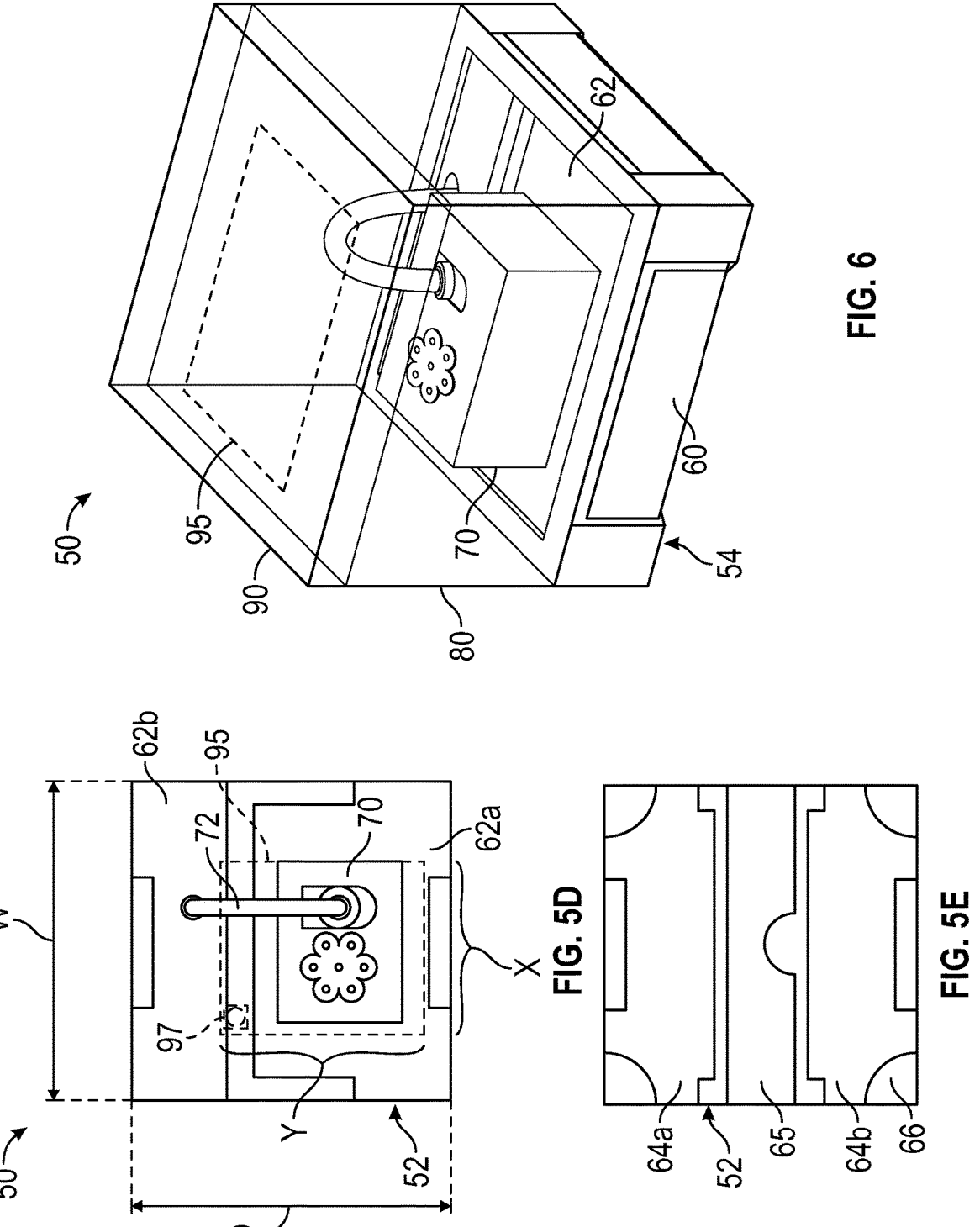

FIG. 6 illustrates a ceramic-type package 54 for the VCSEL-based flood illuminator 50. Blind via holes may be difficult to produce in a substrate manufactured in a high-temperature co-fired ceramic (HTCC) process. As shown here, a solder mask can be used in this package 54 to cover the through-hole to keep molding feasibility. The dimensions of this package 54 and its features can be comparable to those discussed above.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A flood illuminator, comprising:
 a substrate having bottom and top surfaces, the bottom surface having bottom electrodes, the top surface having top electrodes;
 a vertical-cavity surface-emitting laser (VCSEL) die mounted in electrical communication with the top electrodes and being configured to emit laser illumination;
 an encasement disposed on the top surface of the substrate and encasing the VCSEL die; and
 a diffuser structure nano-imprinted in the encasement adjacent the VCSEL die,
 wherein the encasement includes first and second layers, the first layer disposed on the top surface of the substrate and encasing the VCSEL die, and the second layer disposed on the first layer and having the diffuser structure nano-imprinted therein,
 wherein the first layer comprises a silicone-elastomer and has a Shore D hardness and the second layer has a Shore A hardness, the second layer being softer than the first layer.

2. The flood illuminator of claim 1, wherein the substrate comprises a bismaleimide triazine (BT) laminate, a ceramic substrate, or a lead frame.

3. The flood illuminator of claim 1, wherein
 the first layer comprises a potting resin; and
 the second layer comprises a polymer layer disposed on the potting resin.

4. The flood illuminator of claim 1, wherein the second layer comprises a silicone-elastomer or polydimethylsiloxane (PDMS).

5. The flood illuminator of claim 1, wherein the VCSEL die is mounted to one of the top electrodes and is wire-bonded to the other of the top electrodes.

6. The flood illuminator of claim 1, wherein the VCSEL die is flip-chip mounted on the top electrodes.

7. The flood illuminator of claim 1, wherein the substrate comprises vias connecting the bottom electrodes to the top electrodes.

8. The flood illuminator of claim 1, wherein the substrate comprises a solder mask separating the bottom electrodes.

9. The flood illuminator of claim 1, wherein the diffuser structure comprises one or more lenslets having a free-form surface configured to shape incident light into desired illumination or diffused profile.

10. The flood illuminator of claim 9, wherein the device has dimensions of 0.5 mm (W) by 0.5 mm (D) by 0.5 mm (H); wherein the encasement has a thickness of 0.3 mm; and wherein the diffuser structure is arranged at a working distance of 0.15 mm from the VCSEL die.

11. The flood illuminator of claim 1, wherein the diffuser structure comprises a plurality of lenslets having a pitch of 20 microns.

12. The flood illuminator of claim 1, further comprising a working distance between the VCSEL die and the diffuser structure is from 0.15 mm to 0.85 mm.

13. An array of the flood illuminators of claim 1, wherein the substrate of each flood illuminator is part of a common substrate that is shared among the array of flood illuminators.

14. The array of the flood illuminators of claim 1, wherein the first and second layers of each flood illuminators are part of common first and second layers that are shared among the array of flood illuminators.

* * * * *